(12) United States Patent
Ren et al.

(10) Patent No.: US 7,712,068 B2
(45) Date of Patent: May 4, 2010

(54) COMPUTATION OF ELECTRICAL PROPERTIES OF AN IC LAYOUT

(76) Inventors: Zhuoxiang Ren, 444 Saratoga Ave., #4K, Santa Clara, CA (US) 95050; Weidong Zhang, 350 Elan Village La., #103, San Jose, CA (US) 95134; Jim Falbo, 22393 SW. 107th Ave., Tualatin, OR (US) 97062

( * ) Notice: Subject to any disclaimer, the term of this patent is extended or adjusted under 35 U.S.C. 154(b) by 199 days.

(21) Appl. No.: 11/613,118

(22) Filed: Dec. 19, 2006

(65) Prior Publication Data

US 2007/0198967 A1 Aug. 23, 2007

Related U.S. Application Data

(60) Provisional application No. 60/774,334, filed on Feb. 17, 2006, provisional application No. 60/789,704, filed on Apr. 5, 2006.

(51) Int. Cl.
G06F 17/50 (2006.01)
(52) U.S. Cl. ..................................................... 716/19
(58) Field of Classification Search ................... 716/1, 716/4, 19–21
See application file for complete search history.

(56) References Cited

U.S. PATENT DOCUMENTS

| | | | |
|---|---|---|---|
| 4,532,650 A | 7/1985 | Wihl et al. | |
| 4,762,396 A | 8/1988 | Dumant et al. | |
| 5,381,343 A | 1/1995 | Bamji et al. | |
| 5,396,584 A | 3/1995 | Lee et al. | |
| 5,452,224 A | 9/1995 | Smith, Jr. et al. | |
| 5,502,654 A | 3/1996 | Sawahata | |
| 5,566,083 A * | 10/1996 | Fang .............................. | 703/4 |
| 5,610,833 A | 3/1997 | Chang et al. | |
| 5,629,860 A | 5/1997 | Jones et al. | |
| 5,723,233 A | 3/1998 | Garza et al. | |
| 5,790,416 A | 8/1998 | Norton et al. | |
| 5,815,685 A | 9/1998 | Kamon | |
| 5,825,647 A | 10/1998 | Tsudaka | |
| 5,879,844 A | 3/1999 | Yamamoto et al. | |
| 5,901,063 A | 5/1999 | Chang et al. | |

(Continued)

FOREIGN PATENT DOCUMENTS

JP 09-319067 12/1997

(Continued)

OTHER PUBLICATIONS

Adam et al., "Improved Modeling Performance with an Adapted Vectorial Formulation of the Hopkins Imaging Equation," *Proceedings of SPIE: Optical Microlithography XVI*, vol. 5040, pp. 78-91 (Feb. 25, 2003) 14 pages.

(Continued)

*Primary Examiner*—Stacy A Whitmore
(74) *Attorney, Agent, or Firm*—Klarquist Sparkman, LLP

(57) ABSTRACT

A system for calculating electrical properties of features to be created in an integrated circuit. All or a portion of a desired layout design is corrected for photolithographic or other process distortions using one or more resolution enhancement techniques. A simulated layout image of a corrected layout is used as an input to a field solver program that calculates the electrical properties of the features as they will be printed on a wafer.

20 Claims, 4 Drawing Sheets

U.S. PATENT DOCUMENTS

| | | | |
|---|---|---|---|
| 5,991,006 A | 11/1999 | Tsudaka | |
| 5,999,726 A | 12/1999 | Ho | |
| 6,016,357 A | 1/2000 | Neary et al. | |
| 6,033,814 A | 3/2000 | Burdorf et al. | |
| 6,038,020 A | 3/2000 | Tsukuda | |
| 6,042,257 A | 3/2000 | Tsudaka | |
| 6,047,116 A | 4/2000 | Murakami et al. | |
| 6,049,660 A | 4/2000 | Ahn et al. | |
| 6,056,785 A | 5/2000 | Chisaka | |
| 6,077,310 A | 6/2000 | Yamamoto et al. | |
| 6,080,527 A | 6/2000 | Huang et al. | |
| 6,099,581 A | 8/2000 | Sakai | |
| 6,120,952 A | 9/2000 | Pierrat et al. | |
| 6,128,067 A | 10/2000 | Hashimoto | |
| 6,175,947 B1 | 1/2001 | Ponnapalli et al. | |
| 6,187,483 B1 | 2/2001 | Capodieci et al. | |
| 6,226,781 B1 | 5/2001 | Nistler et al. | |
| 6,230,299 B1 | 5/2001 | McSherry et al. | |
| 6,243,855 B1 | 6/2001 | Kobayashi et al. | |
| 6,249,904 B1 | 6/2001 | Cobb | |
| 6,263,299 B1 | 7/2001 | Aleshin et al. | |
| 6,269,472 B1 | 7/2001 | Garza et al. | |
| 6,289,412 B1 | 9/2001 | Yuan et al. | |
| 6,301,697 B1 | 10/2001 | Cobb | |
| 6,314,545 B1* | 11/2001 | Kapur et al. | 716/5 |
| 6,363,516 B1 | 3/2002 | Cano et al. | |
| 6,370,679 B1 | 4/2002 | Chang et al. | |
| 6,415,421 B2* | 7/2002 | Anderson et al. | 716/4 |
| 6,425,113 B1* | 7/2002 | Anderson et al. | 716/5 |
| 6,425,117 B1 | 7/2002 | Pasch et al. | |
| 6,430,737 B1 | 8/2002 | Cobb et al. | |
| 6,438,729 B1* | 8/2002 | Ho | 716/1 |
| 6,449,754 B1 | 9/2002 | You et al. | |
| 6,453,452 B1 | 9/2002 | Chang et al. | |
| 6,453,457 B1 | 9/2002 | Pierrat et al. | |
| 6,467,076 B1 | 10/2002 | Cobb | |
| 6,470,489 B1 | 10/2002 | Chang et al. | |
| 6,499,003 B2 | 12/2002 | Jones et al. | |
| 6,499,131 B1 | 12/2002 | Savithri et al. | |
| 6,526,549 B1 | 2/2003 | You | |
| 6,536,021 B2 | 3/2003 | Keller et al. | |
| 6,560,766 B2 | 5/2003 | Pierrat et al. | |
| 6,574,784 B1 | 6/2003 | Lippincott et al. | |
| 6,620,561 B2 | 9/2003 | Winder et al. | |
| 6,625,611 B1 | 9/2003 | Teig et al. | |
| 6,637,010 B2 | 10/2003 | Yamamoto | |
| 6,643,616 B1 | 11/2003 | Granik et al. | |
| 6,643,831 B2 | 11/2003 | Chang et al. | |
| 6,649,309 B2 | 11/2003 | Mukherjee | |
| 6,668,367 B2 | 12/2003 | Cobb et al. | |
| 6,701,492 B2 | 3/2004 | Jaklic et al. | |
| 6,728,946 B1 | 4/2004 | Schellenberg et al. | |
| 6,748,578 B2 | 6/2004 | Cobb | |
| 6,792,590 B1 | 9/2004 | Pierrat et al. | |
| 6,817,003 B2 | 11/2004 | Lippincott et al. | |
| 6,857,109 B2 | 2/2005 | Lippincott | |
| 6,887,633 B2 | 5/2005 | Tang | |
| 6,901,574 B2 | 5/2005 | LaCour et al. | |
| 6,928,634 B2 | 8/2005 | Granik et al. | |
| 6,931,613 B2 | 8/2005 | Kauth et al. | |
| 6,973,633 B2 | 12/2005 | Lippincott et al. | |
| 7,010,776 B2 | 3/2006 | Gallatin et al. | |
| 7,013,439 B2 | 3/2006 | Robles et al. | |
| 7,017,141 B2 | 3/2006 | Anderson et al. | |
| 7,024,655 B2 | 4/2006 | Cobb | |
| 7,028,284 B2 | 4/2006 | Cobb et al. | |
| 7,047,516 B2 | 5/2006 | Futatsuya | |
| 7,069,534 B2 | 6/2006 | Sahouria et al. | |
| 7,073,162 B2 | 7/2006 | Cobb et al. | |
| 7,089,511 B2 | 8/2006 | Allen et al. | |
| 7,093,206 B2* | 8/2006 | Anand et al. | 716/1 |
| 7,124,380 B2 | 10/2006 | Keller et al. | |
| 7,155,689 B2 | 12/2006 | Pierrat et al. | |
| 7,155,699 B2 | 12/2006 | Cobb | |
| 7,172,838 B2 | 2/2007 | Maurer et al. | |
| 7,174,531 B2 | 2/2007 | Schellenberg et al. | |
| 7,181,721 B2 | 2/2007 | Lippincott et al. | |
| 7,194,704 B2* | 3/2007 | Kotani et al. | 716/2 |
| 7,237,221 B2 | 6/2007 | Granik et al. | |
| 7,240,305 B2 | 7/2007 | Lippincott | |
| 7,240,321 B2 | 7/2007 | Cobb et al. | |
| 7,269,804 B2* | 9/2007 | Tabery et al. | 716/4 |
| 7,281,234 B2 | 10/2007 | Lippincott | |
| 7,293,249 B2 | 11/2007 | Robles et al. | |
| 7,324,930 B2 | 1/2008 | Cobb | |
| 7,367,009 B2 | 4/2008 | Cobb et al. | |
| 7,412,675 B2 | 8/2008 | Kauth et al. | |
| 2002/0026621 A1 | 2/2002 | Mukai | |
| 2002/0100005 A1* | 7/2002 | Anderson et al. | 716/5 |
| 2002/0104063 A1 | 8/2002 | Chang et al. | |
| 2002/0112216 A1 | 8/2002 | Keller et al. | |
| 2003/0005400 A1 | 1/2003 | Karniewicz | |
| 2003/0192013 A1 | 10/2003 | Cote et al. | |
| 2004/0010762 A1 | 1/2004 | Habitz | |
| 2004/0044984 A1* | 3/2004 | Keogan et al. | 716/21 |
| 2004/0128643 A1 | 7/2004 | Buechner et al. | |
| 2005/0149901 A1 | 7/2005 | Tang | |
| 2005/0204322 A1* | 9/2005 | Kotani et al. | 716/10 |
| 2005/0229125 A1* | 10/2005 | Tabery et al. | 716/5 |
| 2005/0251771 A1 | 11/2005 | Robles | |
| 2005/0278686 A1 | 12/2005 | Word et al. | |
| 2005/0283747 A1* | 12/2005 | Adam | 716/4 |
| 2006/0005154 A1* | 1/2006 | Cobb et al. | 716/5 |
| 2006/0188796 A1 | 8/2006 | Word | |
| 2006/0199084 A1 | 9/2006 | Word | |
| 2006/0200790 A1 | 9/2006 | Shang et al. | |
| 2006/0236299 A1 | 10/2006 | Sahouria et al. | |
| 2006/0240342 A1 | 10/2006 | Tang | |
| 2006/0271888 A1* | 11/2006 | Meuris et al. | 716/4 |
| 2007/0074143 A1 | 3/2007 | Cobb et al. | |
| 2007/0118826 A1 | 5/2007 | Lippincott | |
| 2007/0124708 A1 | 5/2007 | Robles et al. | |
| 2007/0198967 A1 | 8/2007 | Ren et al. | |
| 2007/0209030 A1* | 9/2007 | Tabery et al. | 716/21 |
| 2008/0109766 A1* | 5/2008 | Song et al. | 716/2 |
| 2008/0141195 A1 | 6/2008 | Robles et al. | |
| 2008/0148216 A1* | 6/2008 | Chan et al. | 716/19 |

FOREIGN PATENT DOCUMENTS

| | | |
|---|---|---|
| JP | 11-102380 | 4/1999 |
| JP | 2004-502961 | 1/2004 |
| WO | 99/14637 | 3/1999 |
| WO | 99/14638 | 3/1999 |
| WO | 01/65315 | 9/2001 |
| WO | 01/97096 | 12/2001 |
| WO | 2006/127408 | 11/2006 |
| WO | 2006/127438 | 11/2006 |
| WO | 2007/097935 | 8/2007 |

OTHER PUBLICATIONS

Bailey et al., "Intensive 2D SEM Model Calibration for 45nm and Beyond," *Proceedings of SPIE*, vol. 6154, (Feb. 21, 2006) 10 pages.

Cobb et al., "Experimental Results on Optical Proximity Correction With Variable Threshold Resist Model," *Proceedings of SPIE: Symposium on Optical Microlithography X*, vol. 3051, pp. 458-468 (Mar. 10-14, 1997) 11 pages.

Cobb et al., "Fast, Low-Complexity Mask Design," *Proceedings of SPIE: Symposium on Optical/Laser Microlithography VIII*, vol. 2440, pp. 313-327 (Feb. 22-24, 1995) 15 pages.

Cobb et al., "Fast Sparse Aerial Image Calculation for OPC," *Proceedings of SPIE: 15th Annual BACUS Symposium on Photomask Technology and Management*, vol. 2621, pp. 534-545 (Sept. 20-22, 1995) 12 pages.

Cobb, "Flexible Sparse and Dense OPC Algorithms," *Proceedings of SPIE, Photomask and Next-Generation Lithography Mask Technology XII*, vol. 5853, pp. 693-702 (Apr. 13, 2005) 10 pages.

Cobb et al., "Large Area Phase-Shift Mask Design," *Proceedings of SPIE, Symposium on Optical/Laser Microlithography VII*, vol. 2197, pp. 348-360 (Mar. 2-4, 1994) 13 pages.

Cobb et al., "Mathematical and CAD Framework for Proximity Correction," *Proceedings of SPIE: Symposium on Optical Microlithography IX*, vol. 2726, pp. 208-222 (Mar. 13-15, 1996) 15 pages.

Cobb et al., "Model-Based OPC Using the MEEF Matrix," *Proceedings of SPIE, 22nd Annual BACUS Symposium on Photomask Technology*, vol. 4889, (Sept. 30-Oct. 4, 2002) 10 pages.

Cobb et al., "New Concepts in OPC," *Proceedings of SPIE: Optical Microlithography XVII*, vol. 5377, pp. 680-690 (Feb. 24, 2004) 11 pages.

Cobb et al., "OPC Methods to Improve Image Slope and Process Window," Proceedings of SPIE: Design and Process Integration for Microelectronic Manufacturing, vol. 5042, pp. 116-125 (Feb. 27, 2003) 10 pages.

Cobb et al., "Using OPC to Optimize for Image Slope and Improve Process Window," *Proceeding of SPIE, Photomask*, vol. 5130, (Apr. 16-18, 2003) 7 pages.

Granik, "Generalized MEEF Theory," *Interface 2001*, (Nov. 2001) 13 pages.

Granik et al., "MEEF as a Matrix," *Proceedings of SPIE: 21st Annual BACUS Symposium on Photomask Technology*, vol. 4562, pp. 980-991 (Oct. 2-5, 2001) 12 pages.

Granik et al., "New Process Models for OPC at sub-90nm Nodes," Proceedings of SPIE: Optical Microlithography XVI, vol. 5040, pp. 1166-1175 (Feb. 25, 2003) 10 pages.

Granik, "Solving Inverse Problems of Optical Microlithography," *Proceedings of SPIE: Optical Microlithography XVIII*, vol. 5754, pp. 506-526 (Mar. 1, 2005) 22 pages.

Granik et al., "Two-Dimensional G-MEEF Theory and Applications," *Proceedings of SPIE: Symposium on Photomask and Next-Generation Lithography Mask Technology IX*, vol. 4754, pp. 146-155 (Apr. 23-25, 2002) 10 pages.

Granik et al., "Universal Process Modeling with VTRE for OPC," *Proceedings of SPIE: Optical Microlithography XV*, vol. 4691, pp. 377-394 (Mar. 5, 2002) 18 pages.

Gupta et al., "Manufacturing-Aware Physical Design," *Computer Aided Design*, pp. 681-687 (Nov. 9-13, 2003) 7 pages.

International Search Report, and Written Opinion of the International Searching Authority, International Application No. PCT/US2007/003651, International Filing Date Feb. 12, 2007, 13 pages.

Maurer et al., "Evaluation of a Fast and Flexible OPC Package: OPTISSIMO," *Proceedings of SPIE: 16th Annual Symposium on Photomask Technology and Management*, vol. 2884, pp. 412-418 (Sept. 18-20, 1996) 7 pages.

Maurer et al., "Process Proximity Correction Using an Automated Software Tool," *Proceedings of SPIE: Optical Microlithography XI*, vol. 3334, pp. 245-253 (Feb. 22-27, 1998) 9 pages.

Mentor Graphics Corporation, News and Views, "DSM Verification and Analysis," including a partial translation, (document marked Mar. 1999) 7 pages.

Mentor Graphics Corporation, News and Views, "OPC," including a partial translation, (document marked Mar. 1999) 11 pages.

Mentor Graphics Corporation, News and Views, "Calibre," including a partial translation, (document marked Apr. 2000) 9 pages.

Ohnuma et al., "Lithography Computer Aided Design Technology for Embedded Memory in Logic," *Japanese Journal of Applied Physics*, vol. 37(12B), pp. 6686-6688 (Dec. 1998) 3 pages.

Pack et al., "Physical and Timing Verification of Subwavelength-Scale Designs—Part I: Lithography Impact on MOSFETs," *Proceedings of SPIE: Design and Process Integration for Microelectronic Manufacturing*, vol. 5042, pp. 51-62 (Feb. 27, 2003) 12 pages.

Pan, "Lithography-Aware Physical Design," *ASIC*, pp. 35-36 (Oct. 24-27, 2005) 2 pages.

Ren et al., "Computation of Parasitic Capacitances of an IC Cell in Accounting for Photolithography Effect," *Proceedings of the Sixth International Conference on Computational Elektromagnetics (CEM 2006)*, pp. 163-164 (Apr. 4-6, 2006) 3 pages.

Scheffer, "Physical CAD Changes to Incorporate Design for Lithography and Manufacturability," Proceedings of the 2004 Conference on Asia South Pacific Design Automation, pp. 768-773 (Jan. 27-30, 2004) 6 pages.

Schellenberg, "Sub-Wavelength Lithography Using OPC," *Semiconductor Fabtech*, 9th Edition., pp. 205-209 (Mar. 1999) 5 pages.

Wong, *Resolution Enhancement Techniques in Optical Lithography*, Chapter 4, "Optical Proximity Correction," pp. 91-115 (Mar. 2001) 31 pages.

Word et al. "Advanced Layout Fragmentation and Simulation Schemes for Model Based OPCC," *Proceedings of SPIE: Optical Microlithography XVIII*, vol. 5754, pp. 1159-1168 (Mar. 1, 2005) 10 pages.

Yang et al., "Advanced Timing Analysis Based on Post-OPC Extraction of Critical Dimensions," *ACM/IEEE Design Automation Conference*, pp. 359-364 (Jun. 13, 2005) 6 pages.

\* cited by examiner

COMPUTATION OF ELECTRICAL PROPERTIES OF AN IC LAYOUT

CROSS-REFERENCE(S) TO RELATED APPLICATION(S)

The present application claims the benefit of U.S. Provisional Application Nos. 60/774,334, filed Feb. 17, 2006, and 60/789,704, filed Apr. 5, 2006, which are herein expressly incorporated by reference.

BACKGROUND OF THE INVENTION

In the design of integrated circuits, it is important to be able to estimate the electrical properties of the various circuit features. Such electrical properties typically include resistance of conductors and capacitances between various circuit features. In areas of the circuit where timing is critical, the electrical properties must be accurately predicted if the circuit is to operate properly.

In conventional integrated circuit processing, a chip manufacturer provides data that is used in estimating the electrical properties. Such data may include the thickness and dielectric constants of the various layers of the integrated circuit as well as the minimum spacing and minimum size of the features that can be created on the circuit. In addition, the manufacturer may provide a general distortion factor by which circuit features created on a wafer differ from their desired size. For example, during processing, some features may be smaller than desired, while others may be larger than desired. This general distortion factor and other process data are used by a field solver program to estimate the electrical properties of the features in an integrated circuit to be manufactured.

The above approach works quite well for an integrated circuit designs where the pattern of features created on a wafer closely matches the desired layout pattern. However, the technique can produce errors for designs whereby process distortions cause the pattern created on a wafer to vary significantly from the desired layout pattern.

SUMMARY OF THE INVENTION

To address the above-discussed problems, the present invention is a technique for improving the accuracy of integrated circuit electrical simulations by taking into account photolithographic and other distortions that may occur during processing.

In one embodiment of the invention, an integrated circuit layout design defines a number of features to be created on wafer. The layout design, or portion thereof, is corrected with one or more resolution enhancement techniques (RETs) such as optical and process correction (OPC) to improve the fidelity of the features to be created on a wafer. A print image simulation is performed on the corrected layout that estimates how the features of the IC design will be formed on a wafer. The simulated layout image is then used as an input to a field solver program to estimate the electrical properties of the integrated circuit features.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENTS

As indicated above, the present invention is a system for improving the accuracy of estimated electrical properties of features to be created in an integrated circuit.

Figure 1:
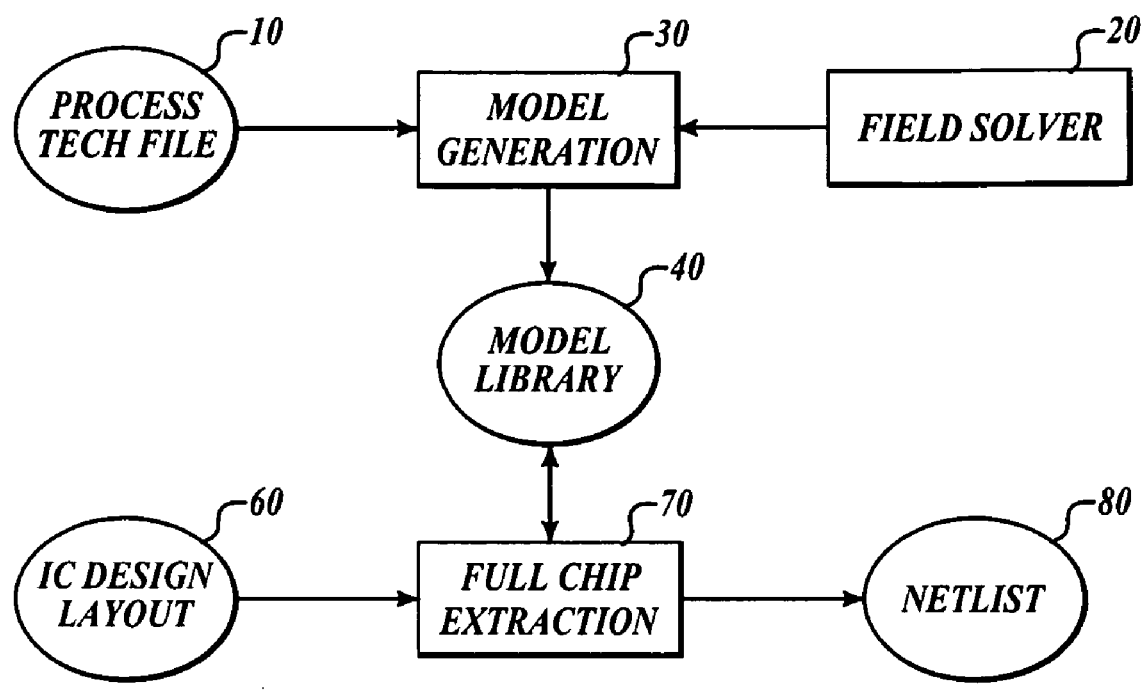
FIG. 1 illustrates a conventional process for determining electrical properties of features in an integrated circuit design.

FIG. 1 illustrates a conventional technique for estimating the electrical properties of features to be created in an integrated circuit (IC). With this technique, a process file 10 is received from an integrated circuit manufacturer. The process file 10 includes a number of parameters from the manufacturer that are required to estimate the electrical properties of the circuit features defined by an IC layout design. These parameters may include the thicknesses of the various layers in an integrated circuit as well as dielectric constants of the various layers. In addition, the process file may include the minimum spacing between features of the integrated circuit as well as the minimum feature size. These and other commonly used circuit parameters are used by a model generator 30 in conjunction with a field solver program 20 such as Raphael available from Synopsys, Quickcap available from Magma, Maxwell available from Ansoft, MCS2/MCS3 available from Mentor Graphics to develop equations or models that estimate the electrical properties of the various circuit features. The equations or models produced by the model generator 30 may be stored in a library 40 that is accessed by computer program to estimate the electrical properties of the various features in an entire layout design.

To estimate the electrical properties of the features in the layout design, a computer program receives all or a portion of a desired or target layout design 60 and analyzes the features with a full chip extraction program 70. The full chip extraction program 70 analyzes the features to be created in each layer of the integrated circuit to determine the electrical interactions between features in the same layer and between features in different layers of the integrated circuit. The full chip extraction program 70 interacts with the model library 40 to produce estimates of the electrical properties such as the resistance, capacitance or inductance of the various circuit features. The output of the full chip extraction program 70 is a netlist 80 that can be used by electrical circuit modeling programs, such as SPICE™ or others, to determine the electrical behavior of the circuit.

The system shown in FIG. 1 works quite well for photolithographic systems where the feature shapes defined in the desired layout closely match what is created on the wafer. However in photolithographic systems where the features to be created on a wafer are smaller than the wavelength of light used to expose the wafer, or where the features are placed very close to each other, optical and other process distortions may occur. For these types of layouts, the features patterns defined by the desired layout may bear little resemblance to how the features will be created on a wafer. For features that are distorted on a wafer, using the description of the features in the layout file to estimate the electrical properties of the features can lead to inaccuracies.

Figure 2:
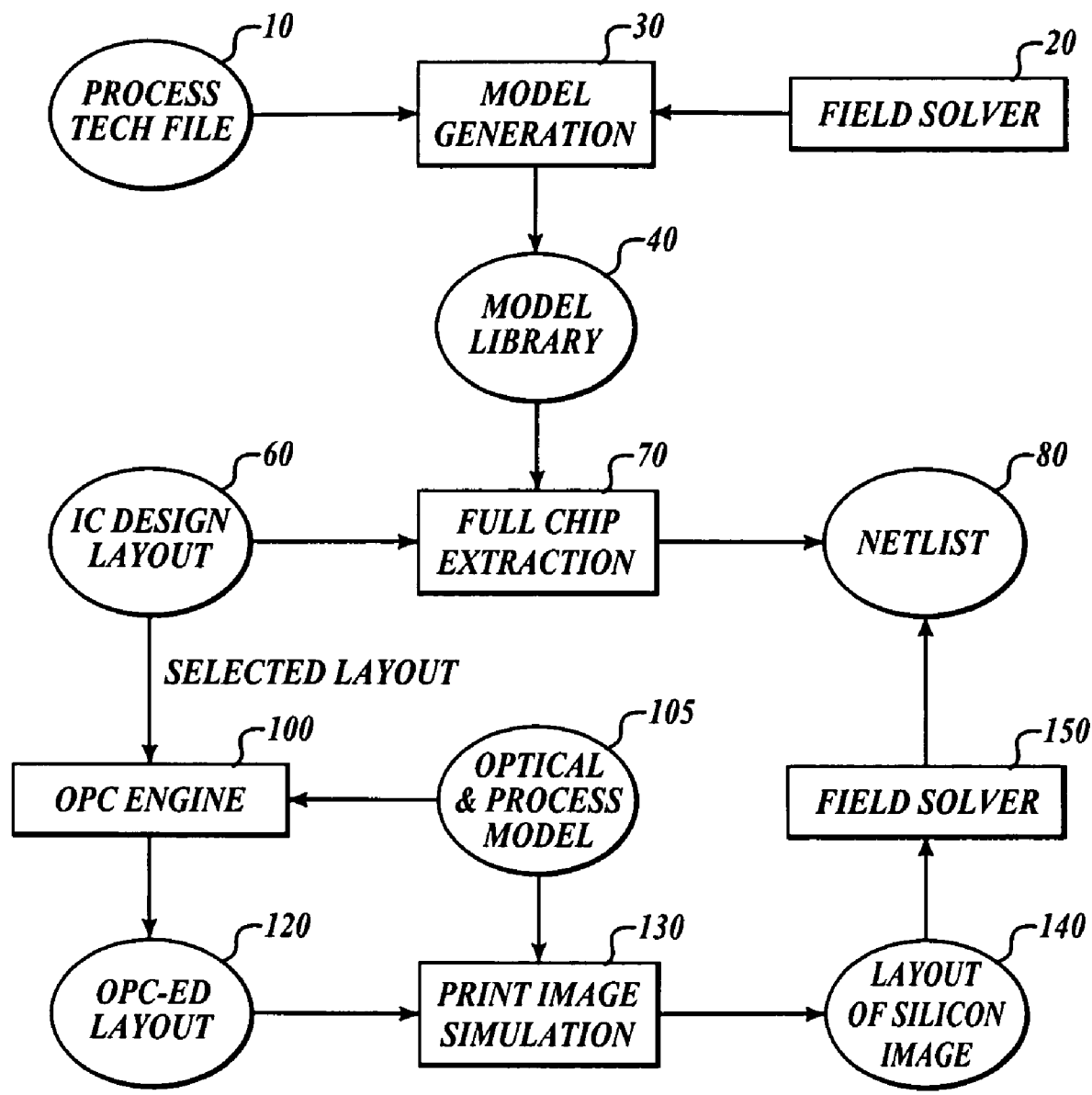
FIG. 2 illustrates a process for determining electrical properties of features in an integrated circuit design in accordance with one embodiment of the present invention.

FIG. 2 illustrates one system for calculating the electrical properties of features to be created in an integrated circuit in accordance with an embodiment of the present invention. In the embodiment shown, at least a portion of the desired integrated circuit layout design 60 is read and supplied to a resolution enhancement technique (RET) tool such as an optical and process correction (OPC) engine 100 that compensates for distortions that may occur during the photolithographic printing process. Such distortions may include optical distortions or process distortions such as etch effects, etc. In general, the OPC engine 100 operates to modify one or more features in the layout design by biasing the edges of the features either inwards or outwards to precompensate for the anticipated process distortions. The OPC engine 100 receives information from an optical and process model 105 that realistically captures the properties of the optical systems and processes that a manufacturer uses to produce a design on a silicon wafer. Inputs to the optical and process model 105 include optical parameters such as the numerical aperture, wavelength and illumination pattern used in the photolithographic tools. In addition, the optical and process model can be calibrated by comparing a desired test pattern with measurements made from a wafer on which the test pattern is formed. In one embodiment, CALIBRE™ Workbench Model Center available from Mentor Graphics of Wilsonville, Oreg., the assignee of the present invention, can be used to build the optical and process model 105. With the OPC correction, the features formed on a wafer will more closely match the desired target layout design. One suitable OPC engine 100 is the CALIBRE™ software suite available from Mentor Graphics.

The output of the OPC engine 100 is an OPC-corrected layout 120. The OPC-corrected layout 120 is analyzed by a print image simulation engine 130 such as Mentor Graphic's PRINT IMAGE function within CALIBRE that simulates how the features in the corrected layout design will be created on a wafer. In one embodiment, the print image simulation engine 130 interacts with the optical and process model 105 to simulate the photolithographic process that will be used to create the integrated circuit. The output of the print image simulation engine 130 is a simulated layout image 140 that defines a number of features as they will be created on a wafer. Typically, each feature in the simulated layout image 140 is defined as a polygon having a somewhat irregular shape due to the photolithographic and other process distortions. To estimate the electrical properties of the features as they will be created on the wafer, the features defined in the simulated layout image 140 are provided to the field solver program 150. The field solver 150 produces a netlist 80 defining individual parasitic capacitances, resistances or inductances for use by an electrical circuit simulation program.

The field solver program 150 may be the same as the field solver program 20 described above. However, the field solver should be able to handle the complex shapes of the features defined in simulated layout image. Such field solvers include the solvers base on the finite element method or the boundary element method. In one embodiment of the invention, the field solver program 150 is a finite element field solver program such as Maxwell available from Ansoft, MCS2/MCS3 available from Mentor Graphics.

In one embodiment of the invention, only a selected portion of the desired integrated circuit layout design 60 is subjected to the OPC engine 100 and used by the field solver program 150 to generate the netlist 80. However, if time and processing power permits, the entire desired layout design could be analyzed in this manner.

For those circuit features that are either larger in size, are not critical to the operation of the circuit or are not subject to such process distortions, the electrical properties of the features may be estimated using the process file 10, the field solver program 20, the model generator 30, the model library 40 and the full chip extraction tool 70 as described above.

Figure 3:
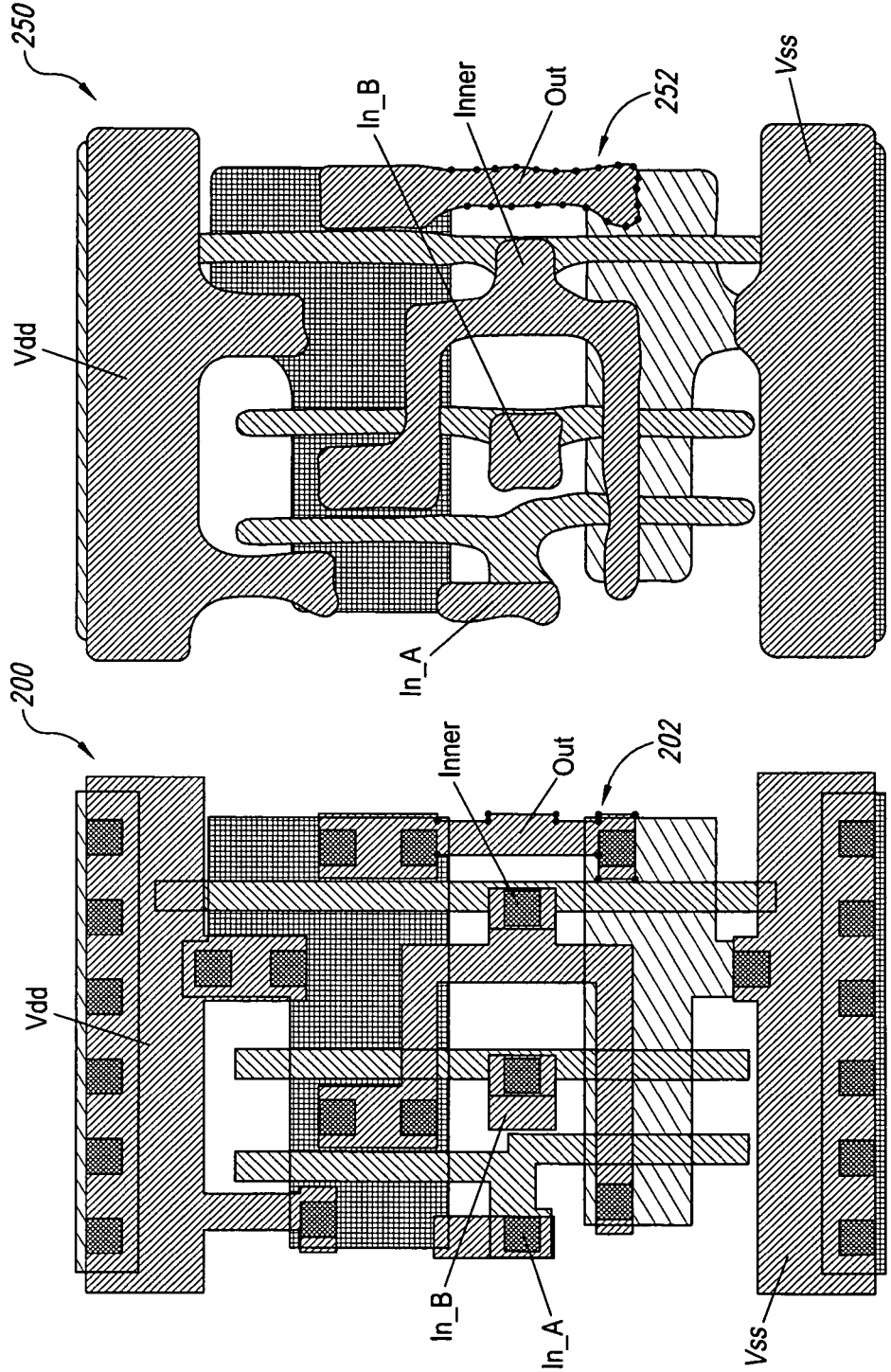
FIG. 3 illustrates a desired layout pattern and a simulated layout image of the desired layout pattern.

FIG. 3 illustrates an example of a desired layout design 200 and a corresponding simulated layout image 250. The desired layout design 200 includes a number of features that are defined as a sequence of polygon vertices 202 in a layout description language such as GDSII™ or OASIS™. The desired layout design 200 may be defined hierarchically, whereby circuit features or groups of circuit features that are repeated in the layout design are defined as cells in the database along with references to each placement of the cells.

As will be appreciated by those skilled in the art, photolithographic and other distortions often cause errors such that what is actually created on a wafer does not match the desired layout. Depending on the extent of the distortions, the circuit features may not operate as the circuit designer intended or may not operate at all.

To correct for the photolithographic distortions, the OPC correction engine 100 alters one or more of the polygons defined by the desired layout design so that what is created on the wafer more closely matches the desired layout. OPC engine 100 generally operates by dividing the edges of the polygons into a number of edge fragments and selectively biasing one or more of the edge fragments inwards or outwards to improve the fidelity of the feature created on the wafer. In addition, extra features such as hammerheads, serifs, or other patterns can be added to the layout features to improve their fidelity. In some cases, the resolution enhancement techniques may add additional features such as subresolution assist features (SRAFs) or phase shifters that are used to improve image fidelity. The simulated layout image 250 shown in FIG. 3 as determined by the print image function represents the features that will be created on a wafer from an OPC-corrected layout. The polygons defining the features as they will be formed on a wafer generally include a larger number of vertices 252 to define the irregular boundaries of the features.

Figure 4:
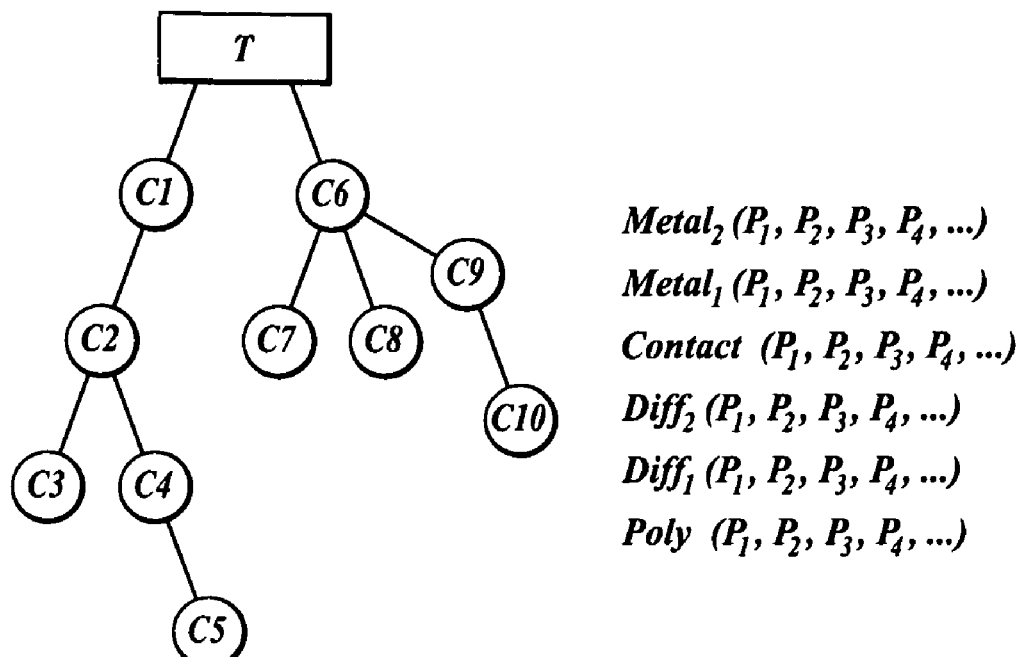
FIG. 4 illustrates a hierarchical organization of a layout design and corresponding sets of polygons defining features in various layers of an integrated circuit.

In some embodiments, the field solver program 150 requires a particular description of a circuit layout in order to be able to compute the various electrical properties of the features in the layout. In one embodiment of the invention, the simulated layout image produced by the print image function is defined hierarchically such as shown in FIG. 4. A hierarchical layout description includes a top cell T and a number of subcells C1, C2, C3, . . . , C10. Each of the subcells defines a pattern of features (e.g., polygons) to be created on a wafer. Some field solver programs 150 require the feature polygons to be defined on a layer-by-layer basis such as a list of all the features in the poly layer, the diffusion 1 layer, the diffusion region 2 layer, the contact layer, the metal 1 layer, the metal 2 layer, etc. To convert the hierarchical description of the simulated layout image into a layer-by-layer format that the field solver program 150 can understand, the hierarchical description of the simulated layout image is analyzed to determine which features are in which layer of the integrated circuit. In one embodiment, a recursive tree searching algorithm is used to retrieve those features in each layer and to define files or other data collections for each layer of the integrated circuit.

The following is an example of an output file that defines a number of polygons in a simulated layout image. The file is ready by the field solver program 150 to estimate the electrical properties of the features. In the embodiment shown, each polygon is defined by the number of vertices in the polygon followed by the location of each vertex on a layout grid used by the field solver.

polygon 4
    −0.070000 1.005000 0.070000 1.005000 0.070000 1.420000 −0.070000 1.420000
polygon 4
    0.375000 1.005000 0.630000 1.005000 0.630000 1.235000 0.375000 1.235000
polygon 14
    0.010000 0.740000 1.010000 0.740000 1.010000 1.010000 1.210000 1.010000 1.210000 1.230000 1.010000 1.230000 1.010000 1.530000 0.530000 1.530000 0.530000 1.810000 0.310000 1.810000 0.310000 1.410000 0.890000 1.410000 0.890000 0.860000 0.010000 0.860000
polygon 8
    −0.200000 −0.070000 1.600000 −0.070000 1.600000 0.320000 1.040000 0.320000 1.040000 0.410000 0.820000 0.410000 0.820000 0.320000 −0.200000 0.320000
polygon 16
    −0.200000 2.200000 0.020000 2.200000 0.020000 1.865000 −0.050000 1.865000 −0.050000 1.745000 0.170000 1.745000 0.170000 1.865000 0.160000 1.865000 0.160000 2.200000 0.820000 2.200000 0.820000 1.850000 1.040000 1.850000 1.040000 2.200000 1.600000 2.200000 1.600000 2.590000 −0.200000 2.590000
polygon 16
    1.250000 0.740000 1.470000 0.740000 1.470000 0.860000 1.450000 0.860000 1.450000 1.005000 1.470000 1.005000 1.470000 1.235000 1.450000 1.235000 1.450000 1.410000 1.470000 1.410000 1.470000 1.810000 1.250000 1.810000 1.250000 1.410000 1.330000 1.410000 1.330000 0.860000 1.250000 0.860000

The field solver program 150 computes the resistances of the various features as well as the capacitances between features from the files defining the features in the various circuit layers. Because the polygons in the simulated layout image of the OPC-corrected features accurately reflect the shape of the features as they will be formed on the wafer, the estimates of the electrical properties is more accurate than if the properties were computed from the desired layout directly. The netlist of the electrical properties computed for the OPC-corrected layout can be combined with one or more netlists created from the non-OPC-corrected layout data in order to simulate the electrical operation of the entire IC design.

Figure 5:
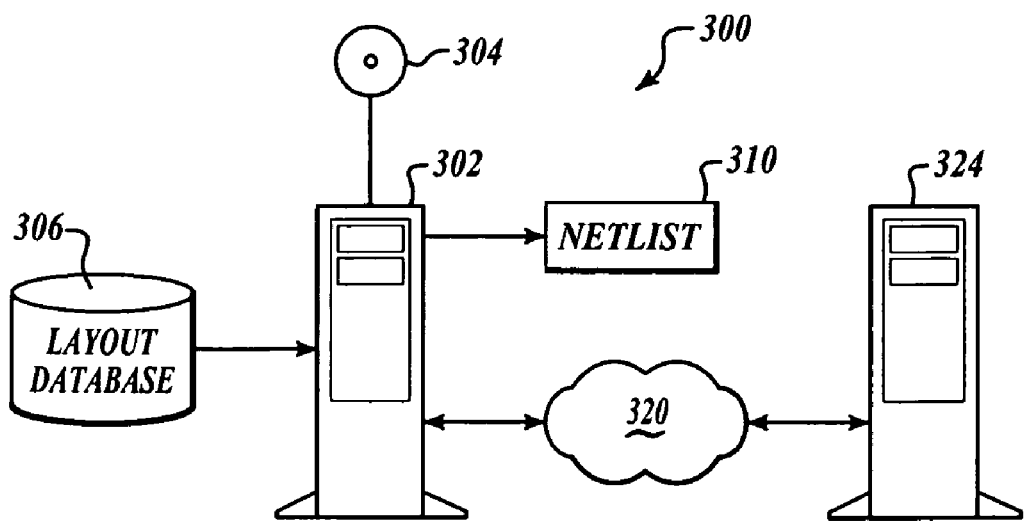
FIG. 5 illustrates a representative computer system for implementing the present invention.

FIG. 5 illustrates a representative computer system 300 that can be used to implement the present invention. A computer 302 receives a set of programmed instructions on a computer readable media 304 such as a CD-ROM, DVD, tape or computer communication link. The computer executes the instructions to read all or a portion of a desired layout from a database 306 or other storage media. The computer than performs one or more resolution enhancement techniques such as OPC to correct a portion of the desired layout for process distortions. The corrected layout data is used to generate a simulated layout image, which in turn is used to calculate the electrical properties of the features in the manner described above.

The computer 302 may be a stand alone or networked device. In addition, the computer 302 may be connected to other computers 324 through a communication link 320 such as the Internet. Processing of the layout may be distributed between connected computers.

While illustrative embodiments have been illustrated and described, it will be appreciated that various changes can be made therein without departing from the scope of the invention as set forth in the following claims.

The invention claimed is:

1. A method comprising:
receiving a target layout design defining features to be created in an integrated circuit or portion thereof;
producing a corrected layout of at least a portion of the target layout design including one or more of the features that are compensated for process distortions using one or more resolution enhancement techniques;
producing a simulated corrected layout image by simulating how the features in the corrected layout will be formed on a wafer; and
using a computer producing a representation of electrical properties of the features in the corrected layout based on the simulated corrected layout image and using a field solver.

2. The method of claim 1, wherein the simulated corrected layout image comprises polygons representing how the features in the corrected layout will be formed on the wafer and the electrical properties of the features in the corrected layout are computed by applying the polygons of the simulated corrected layout image to a finite element field solver.

3. The method of claim 1, wherein the one or more resolution enhancement techniques are implemented using an optical and process correction (OPC) tool.

4. The method of claim 1 wherein the representation of the electrical properties comprises a portion of a netlist stored in a computer-readable medium.

5. The method of claim 1, further comprising:
producing a representation of electrical properties of features in at least one uncorrected portion of the target layout design; and
combining the representation of the electrical properties of the features in the at least one uncorrected portion of the target layout design with the representation of the electrical properties of the features in the corrected layout.

6. A computer-readable storage device storing a sequence of instructions that is executable by a computer to perform a method, the method comprising:
receiving a target layout design defining features to be created in an integrated circuit or portion thereof;
producing a corrected layout of at least a portion of the target layout design including one or more of the features that are compensated for process distortions using one or more resolution enhancement techniques;
producing a simulated corrected layout image by simulating how the features in the corrected layout will be formed on a wafer; and producing a representation of electrical properties of the features in the corrected layout based on the simulated corrected layout image and using a field solver.

7. A system comprising:

a computer configured to execute a sequence of programmed instructions that causes the computer to:

receive a target layout design defining features to be created in an integrated circuit or portion thereof;

produce a corrected layout of at least a portion of the target layout design including features that are compensated for process distortions using one or more resolution enhancement techniques;

produce a simulated corrected layout image by simulating how the features in the corrected layout will be formed on a wafer; and compute the electrical properties of the features in the corrected layout based on the simulated corrected layout image and using a field solver.

8. The method of claim 5, wherein the combining produces a portion of a netlist stored in a computer-readable medium.

9. The method of claim 8, wherein the portion of the netlist describes individual capacitances, resistances, or inductances.

10. The method of claim 8, further comprising simulating the electrical operation of the integrated circuit using the netlist.

11. The method of claim 5, wherein the representation of the electrical properties of the features of the at least one uncorrected portion of the target layout design is produced using a full chip extraction program.

12. The computer-readable storage device of claim 6, wherein the simulated corrected layout image comprises polygons representing how the features in the corrected layout will be formed on the wafer and the electrical properties of the features in the corrected layout are computed by applying the polygons of the simulated corrected layout image to the field solver.

13. The computer-readable storage device of claim 6, wherein the one or more resolution enhancement techniques are implemented using an optical and process correction (OPC) tool.

14. The computer-readable medium of claim 6, wherein the representation of the electrical properties comprises a portion of a netlist.

15. The computer-readable storage device of claim 14, further comprising simulating the electrical operation of the integrated circuit using the netlist.

16. The computer-readable storage device of claim 6, wherein the method further comprises:

producing a representation of electrical properties of features in at least one uncorrected portion of the target layout design; and combining the representation of the electrical properties of the features in the at least one uncorrected portion of the target layout design with the representation of the electrical properties of the features in the corrected layout.

17. The computer-readable storage device of claim 16, wherein the combining produces a netlist stored in a computer-readable medium.

18. The computer-readable storage device of claim 17, wherein the portion of the netlist describes individual capacitances, resistances, or inductances.

19. A method for computing electrical properties of features in an integrated circuit layout design, comprising:

receiving a target layout design defining features to be created in an integrated circuit or portion thereof;

producing a corrected layout including one or more of the features that are compensated for photolithographic process distortions with one or more resolution enhancement techniques;

producing a simulated corrected layout image by simulating how the features in the corrected layout will be formed on a wafer;

using a description of the simulated corrected layout image as an input to a field solver to compute the electrical properties of the features using a computer;

computing electrical properties for uncorrected features in the target layout design; and combining the electrical properties of the uncorrected features with the electrical properties of the features defined by the corrected layout.

20. The method of claim 19, wherein the combined electrical properties are stored in a netlist.

* * * * *